United States Patent
Kwack et al.

(10) Patent No.: US 7,139,210 B2
(45) Date of Patent: Nov. 21, 2006

(54) SYNCHRONOUS SEMICONDUCTOR MEMORY DEVICE FOR REDUCING POWER CONSUMPTION

(75) Inventors: Seung-Wook Kwack, Ichon-shi (KR); Ki-Chang Kwean, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 159 days.

(21) Appl. No.: 11/002,579

(22) Filed: Dec. 3, 2004

(65) Prior Publication Data

US 2005/0242853 A1 Nov. 3, 2005

(30) Foreign Application Priority Data

Apr. 30, 2004 (KR) .................. 10-2004-0030612

(51) Int. Cl.
*G11C 5/14* (2006.01)
(52) U.S. Cl. .................. 365/229; 365/233; 327/156; 331/1 A
(58) Field of Classification Search ........... 365/229, 365/233; 327/156; 331/1 A
See application file for complete search history.

(56) References Cited

U.S. PATENT DOCUMENTS

| | | | |
|---|---|---|---|
| 6,240,048 B1 * | 5/2001 | Matsubara | 365/233 |
| 6,392,458 B1 | 5/2002 | Miller, Jr. et al. | |
| 6,678,206 B1 | 1/2004 | Chu et al. | |
| 6,809,600 B1 | 10/2004 | Chang et al. | |
| 6,987,704 B1 * | 1/2006 | Park | 365/233 |
| 2003/0117881 A1 | 6/2003 | Johnson et al. | |

FOREIGN PATENT DOCUMENTS

KR 10-2002-0075572 A 10/2002

* cited by examiner

*Primary Examiner*—Richard Elms
*Assistant Examiner*—N Nguyen
(74) *Attorney, Agent, or Firm*—McDermott Will & Emery LLP

(57) ABSTRACT

A semiconductor memory device capable of reducing power consumption by employing a DLL drive controller. The semiconductor memory device includes: an idle state detector for detecting an idle state that all banks are precharged; a delay locked loop (DLL) for synchronizing an internal clock with an external clock; and a DLL drive controller for controlling the delay locked loop in response to an idle state detection signal outputted from the idle state detector and a delay locked signal outputted from the DLL.

7 Claims, 1 Drawing Sheet

SYNCHRONOUS SEMICONDUCTOR MEMORY DEVICE FOR REDUCING POWER CONSUMPTION

FIELD OF INVENTION

The present invention relates to a semiconductor device; and, more particularly, to a synchronous dynamic random access memory (SDRAM) for reducing power consumption in an idle state.

DESCRIPTION OF PRIOR ART

For a variety of reasons, power consumption has become an increasingly significant issue for electronic devices such as computer systems. Particularly, according to the advent of Green Round, a specific function for power consumption has been required more and more in a semiconductor memory device nowadays because reducing power consumption is environmentally friendly as it reduces the use of fossil fuels and attendant pollutants.

In a synchronous DRAM (SDRAM), the requirement for reducing power consumption is also an important issue so that various ways have been introduced to meet this demand, of which one is an application of a power-down mode to the SDRAM. The power-down mode is a mode of operation during which system power is conserved, that is to say, a state that the DRAM does not operate. As a result, it is possible to reduce the power consumption in the computer systems by minimizing unnecessary current consumption because a specific operation such as a read or a write operation is not performed. Meanwhile, the memory device can enter the power-down mode from a standby state that waits to perform the specific operation, or from an active state.

However, a device or a system for reducing power consumption in a normal mode rather than the power-down mode which is adaptive for the SDRAM has not been advanced up to date. Typically, when a clock enable signal CKE and a chip select bar signal/CS are in logic high level, respectively, all banks are precharged in the normal mode of the SDRAM. But, during the all-bank precharging, a delay locked loop (DLL) is still operated so as to cause unnecessary power consumption although the SDRAM is put in an idle state that no actual data input/output operation is performed.

With regard to current consumption in the normal mode, there are two kinds of current consumed at the idle state in the SDRAM, of which one is a precharge standby current (IDD2N) in a non power-down mode and the other is a precharge quiet standby current (IDD2Q). In a precharge standby state of the non power-down mode that IDD2N is consumed, the clock enable signal CKE is in logic high level to activate the clock buffer and the other input buffers so that an external command, e.g., a read command, a write command and so forth, can be inputted anytime. Therefore, the IDD2N means a static current which is consumed in the input buffers, despite of the input buffers not receiving any external input command.

As described above, the prior art has a serious shortcoming that there is inevitably happened unnecessary power consumption in the DLL. That is, though the memory device is put in an idle state that whole the banks are precharged and thus, the memory device does not perform any actual operation, the DLL is still operated so that there is unnecessary power consumption in the normal mode of the SDRAM.

SUMMARY OF INVENTION

It is, therefore, an object of the present invention to provide a semiconductor memory device for reducing unnecessary power consumption by using a delay locked loop (DLL) drive controller.

In accordance with an aspect of the present invention, there is provided a semiconductor memory device including: an idle state detector for detecting an idle state that all banks are precharged; a DLL for synchronizing an internal clock with an external clock; and a DLL drive controller for controlling the delay locked loop in response to an idle state detection signal outputted from the idle state detector and a delay locked signal outputted from the DLL.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device incorporating therein a delay locked loop (DLL) drive controller for reducing power consumption in accordance with the present invention will be described in detail referring to the accompanying drawings.

Figure 1:
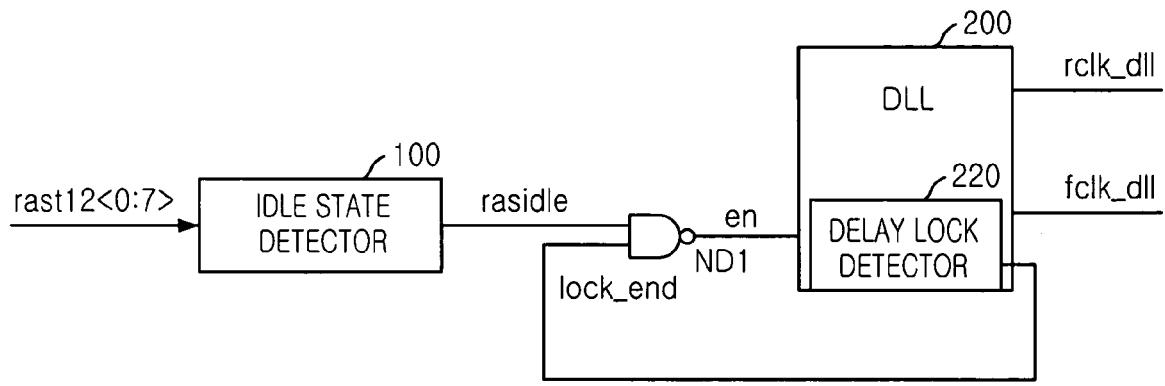
FIG. 1 is a block diagram setting forth a semiconductor memory device for reducing power consumption in accordance with a preferred embodiment of the present invention.

FIG. 1 is a block diagram setting forth a semiconductor memory device for reducing power consumption in accordance with a preferred embodiment of the present invention.

Referring to FIG. 1, the inventive semiconductor memory device includes an idle state detector 100 for detecting an idle state that all banks are precharged, a delay locked loop (DLL) 200 for synchronizing an internal clock with an external clock, and a DLL drive controller ND1 for turning on or off the DLL 200 in response to an idle state detection signal rasidle outputted from the idle state detector 100 and a delay locked signal lock_end outputted from the DLL 200. In detail, the idle detection signal rasidle of the idle state detector 100 is in logic high level after all-bank precharge. Then, in case that the delay locked signal lock_end is in logic high level, the DLL drive controller ND1 performs a logic NAND operation to the bank active signal rasidle<0:7> and the delay locked signal lock_end for generating a DLL enable signal en so as to turn off the DLL 200.

Herein, the DLL 200 is provided with a delay lock detector 220 for outputting the delay locked signal lock_end which informs that a delay-locked state after synchronizing the internal clock with the external clock.

Figure 2:
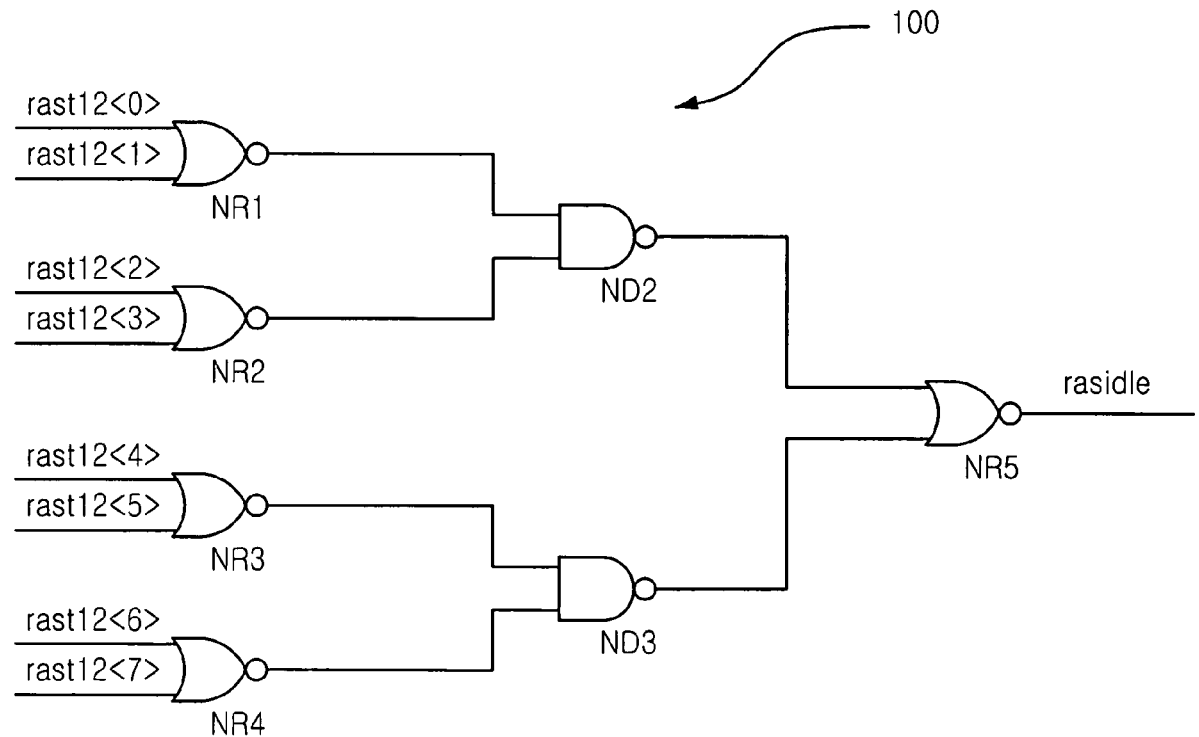
FIG. 2 is a circuit diagram illustrating an idle state detector in the semiconductor memory device for reducing power consumption in accordance with the preferred embodiment of the present invention.

FIG. 2 is a circuit diagram setting forth the idle detector 100 which is depicted in FIG. 1 in accordance with the preferred embodiment of the present invention.

In FIG. 2, the idle detector 100 is provided with a plurality of NOR gates NR1 to NR4 where a plurality of bank active signals rast12<0:7> are inputted, a plurality of NAND gates ND2 and ND3 where the output signals of the plurality of NOR gate NR1 to NR 4 are inputted, and another NOR gate NR5 for outputting the idle state detection signal rasidle where the output signals of the plurality of NAND gates ND2 and ND3 are inputted.

In the preferred embodiment, the plurality of NOR gates NR1 to NR4 incorporates four NOR gates therein. That is, a first and a second bank active signals rast12<0:1> are inputted to a first NOR gate NR1, a third and a fourth bank active signals rast12<2:3> are inputted to a second NOR gate NR2, a fifth and a sixth bank active signals rast12<4:5> are inputted to a third NOR gate NR3, and a seventh and an eighth bank active signals rast12<6:7> are inputted to a fourth NOR gate NR4.

Meanwhile, the plurality of NAND gates are configured with two NAND gates ND2, ND3 in the preferred embodiment. That is, the respective output signals of the first NOR gate NR1 and the second NOR gate NR2 are inputted to a first NAND gate ND2, and the respective output signals of the third NOR gate NR3 and the fourth NOR gate NR4 are inputted to a second NAND gate ND3.

In accordance with the preferred embodiment of the idle state detector 100, the bank active signals rast12<0:7> are in logic low level, respectively, after all-bank precharging. Therefore, the idle state detector 100 outputs the idle detection signal rasidle of logic high level through twice logic NOR operations and one logic NAND operation.

Referring back to FIGS. 1 and 2, the detail description for an operational sequence of the inventive semiconductor memory device for reducing unnecessary power consumption will be illustrated as followings.

To begin with, when the whole banks become precharged, the bank active signals rast12<0:7> are deactivated, that is to say, the bank active signals rast12<0:7> are in logic low level. Then, the idle state detector 100 detects this inactive state and activates the idle state detection signal rasidle. Thereafter, in case that a delay is locked at the DLL 200, the delay locked detector 220 activates the delay locked signal lock_end. Afterwards, when the idle state detection signal rasidle and the delay locked signal lock_end become activated together, the DLL drive controller ND1 activates a DLL enable signal en so as to turn off the DLL 200. In comparison with the prior art, since the DLL 200 is turned off during the idle state after all-bank precharging, it is possible to reduce unnecessary current consumption caused by that the input buffers are unnecessarily operated as the DLL 200 provides the internal clock during the idle state.

Generally, the DRAM is put in an active power-down mode in order to conserve system power when access to the DRAM is not required. Herein, the time of the active power-down mode of the DRAM is maximally about 70 μs. Meanwhile, an exit mode from the active power-down mode is classified into two kinds of mode, i.e., a slow exit mode and a fast exit mode, which are dependent upon whether the DLL 200 is turned on or not. In particular, the slow exit mode from the power-down mode requires about 6 cycles, i.e., about 70 μs. During this time period, since the DLL 200 is turned off, the data stored in memory cells is not updated, which means that the DRAM does not lose the stored data during at least about 70 μs even though the preset value of the DLL 200 is not updated.

Meanwhile, because the time period of the idle state that whole the banks are precharged is about 8 μs, it is understood that the preset information doest not be lost in spite of turning off the DLL 200. In addition, even though we consider the time required for turning on the DLL 200 again including a RAS to CAS delay time (tRCD), the DLL information is still valid because the tRCD is merely about 12 ns.

As described above, the present invention provides an advantage that it is possible to reduce unnecessary current consumption incurred by a precharge standby current in a normal mode, because the DLL 200 is turned off when all banks are precharged by employing the DLL drive controller.

In the preferred embodiment of the present invention, the DLL drive controller ND1 is implemented as the NAND gate for detecting the active state of the idle detection signal rasidle and the delay locked signal lock_end, and then outputting the DLL enable signal en. However, this is only illustrative purpose that the DLL drive controller detects the active state of the delay locked signal and the idle detection signal. Therefore, the DLL drive controller ND1 may be implemented as the other logic circuit instead of the NAND gate, unlike the preferred embodiment of the present invention.

The present application contains subject matter related to the Korean patent application No. KR 2004-30612, filled in the Korean Patent Office on Apr. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   an idle state detector for detecting an idle state that all banks are precharged;
   a delay locked loop (DLL) for synchronizing an internal clock with an external clock; and
   a DLL drive controller for controlling the DLL in response to an idle state detection signal outputted from the idle state detector and a delay locked signal outputted from the DLL.

2. The semiconductor memory device as recited in claim 1, wherein the DLL drive controller includes a NAND gate.

3. The semiconductor memory device as recited in claim 2, wherein the DLL drive controller performs a logic NAND operation to the idle detection signal and the delay locked signal for generating a DLL enable signal, thereby turning off the DLL during an idle state.

4. The semiconductor memory device as recited in claim 1, wherein the DLL includes a delay locked detector for outputting the delay locked signal which informs a delay_locked state after synchronizing the internal clock with the external clock.

5. The semiconductor memory device s recited in claim 1, wherein the idle state detector includes:
   a plurality of NOR gates where bank active signals are inputted;
   a plurality of NAND gates where the output signals of the plurality of NOR gates are inputted; and
   a NOR gate for outputting the idle state detection signal where the output signals of the plurality of NAND gates are inputted.

6. The semiconductor memory device as recited in claim 5, wherein the plurality of NOR gates includes;
   a first NOR gate where a first and a second bank active signals are inputted;
   a second NOR gate where a third and a fourth bank active signals are inputted;
   a third NOR gate where a fifth and a sixth bank active signals are inputted; and
   a fourth NOR gate where a seventh and an eighth bank active signals are inputted.

7. The semiconductor memory device as recited in claim 5, wherein the plurality of NAND gates includes:
a first NAND gate where the output signals of the first and the second NOR gates are inputted; and
a second NAND gate where the output signal of the third and the fourth NOR gates are inputted.

* * * * *